United States Patent [19]

Brown et al.

[11] Patent Number: 4,460,237
[45] Date of Patent: Jul. 17, 1984

[54] CONTACTS FOR CHIP CARRIER SOCKET

[75] Inventors: Vincent B. Brown, Prospect Heights; Robert F. Schlacks, Mount Prospect, both of Ill.

[73] Assignee: Methode Electronics, Inc., Chicago, Ill.

[21] Appl. No.: 335,726

[22] Filed: Dec. 30, 1981

[51] Int. Cl.³ .............................................. H01R 9/00
[52] U.S. Cl. ..................... 339/176 MP; 339/17 CF; 339/217 S; 339/252 R
[58] Field of Search ...... 339/17 CF, 75 MP, 176 MP, 339/217 S, 252 R

[56] References Cited

U.S. PATENT DOCUMENTS

| 3,199,066 | 8/1965 | Eledge et al. | 339/176 MP |
| 3,697,934 | 10/1972 | Merry | 339/217 S |
| 3,793,609 | 2/1974 | McIver | 339/176 MP |
| 3,818,280 | 6/1974 | Smith et al. | 339/176 MP |
| 3,883,207 | 5/1975 | Tomkiewicz | 339/217 S |
| 3,907,394 | 9/1975 | Barnes | 339/17 CF |
| 3,951,491 | 4/1976 | Mysiak | 339/17 CF |
| 3,960,423 | 6/1976 | Weisenburger | 339/17 CF |
| 3,999,827 | 12/1976 | Hutchison et al. | 339/17 CF |
| 4,008,938 | 2/1977 | Anhalt et al. | 339/17 CF |
| 4,036,544 | 7/1977 | Keglewitsch | 339/221 M |
| 4,118,094 | 10/1978 | Key | 339/176 MP |
| 4,188,085 | 2/1980 | Aldridge et al. | 339/17 CF |
| 4,376,560 | 3/1983 | Olsson et al. | 339/17 CF |
| 4,390,220 | 6/1983 | Benasutti | 339/17 CF |

FOREIGN PATENT DOCUMENTS 808723 7/1951 Fed. Rep. of Germany ... 339/217 S

Primary Examiner—John McQuade
Assistant Examiner—Gary K. Paumen
Attorney, Agent, or Firm—Charles F. Pigott, Jr.

[57] ABSTRACT

Contact designs for leadless chip carrier sockets of either the surface compression or the solder type. The contact for a compression type socket employs a dual cantilever configuration mounted on a base member which mechanically isolates one portion of the contact from another. Two cooperative contact designs are used for a solder type socket in which each type is alternately arranged with respect to the other in mounted relationship on a base member. The upper chip carrier contacting portions of the two contacts for a solder type socket are disposed side-by-side along each side wall, while the terminal ends are aligned inwardly perpendicular to the upper alignment.

9 Claims, 13 Drawing Figures

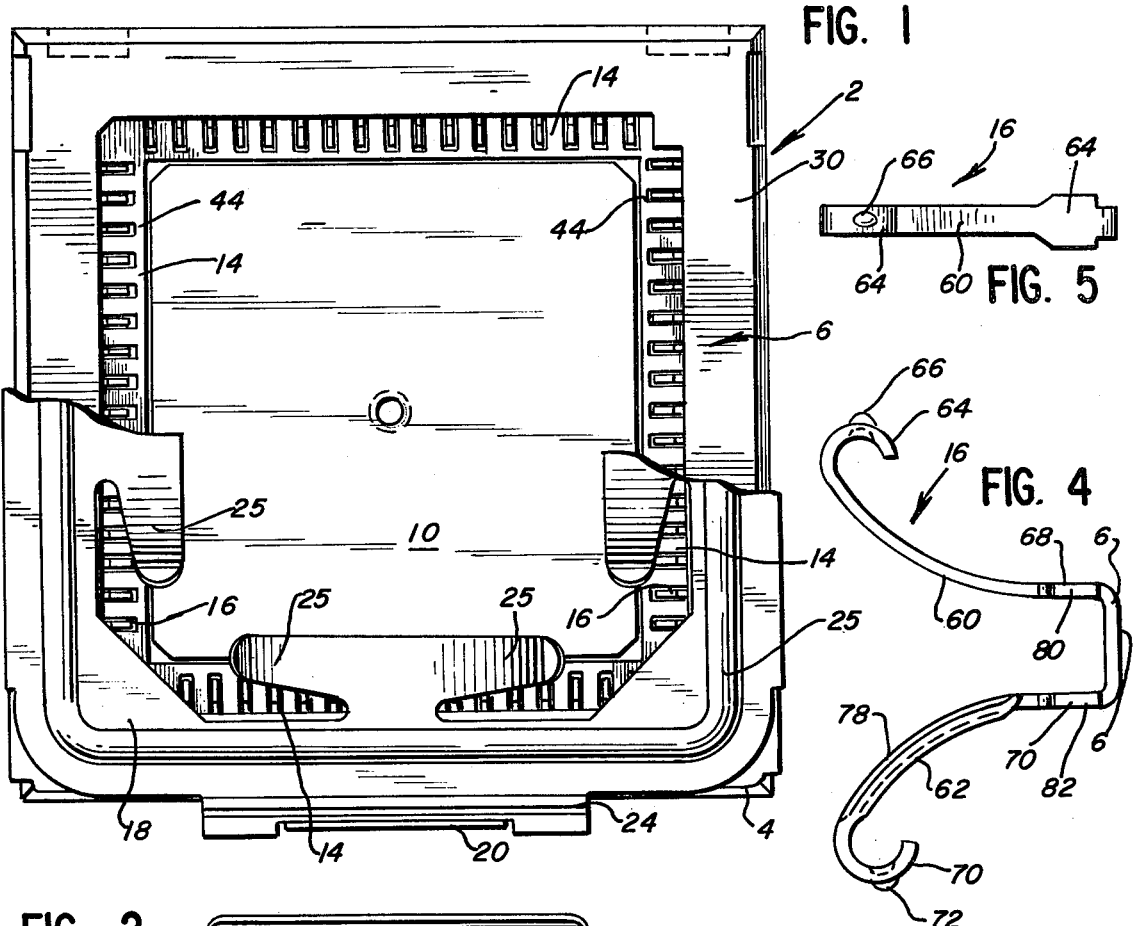
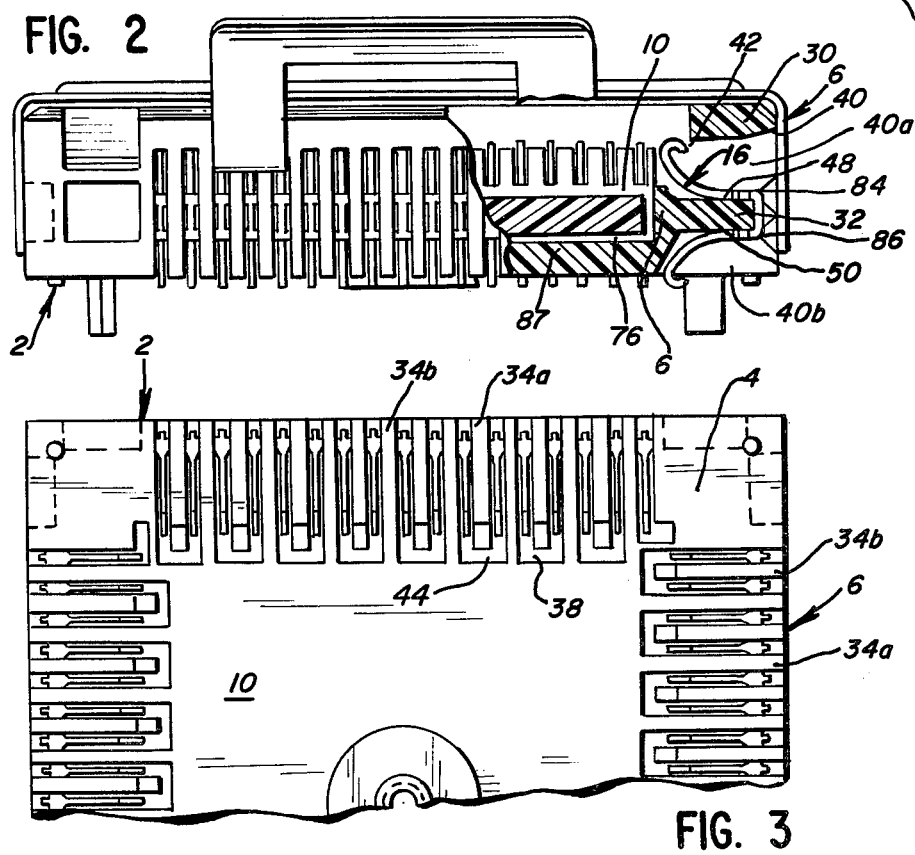

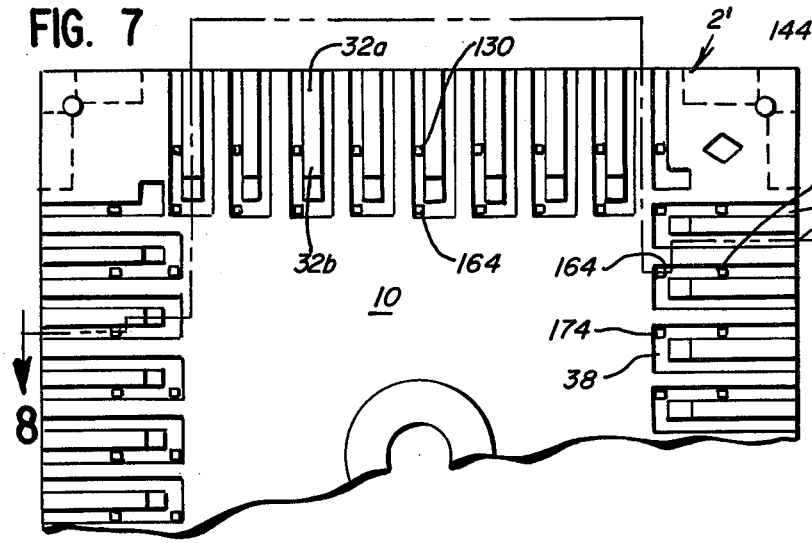
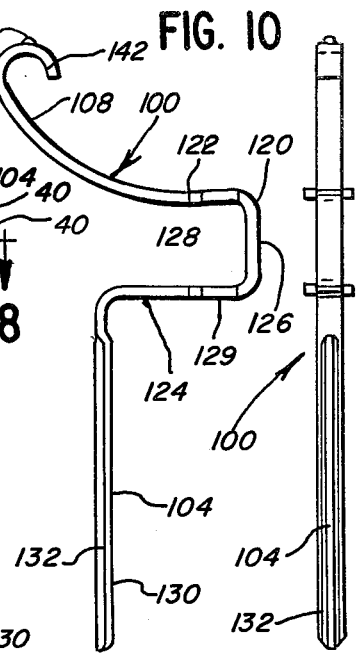
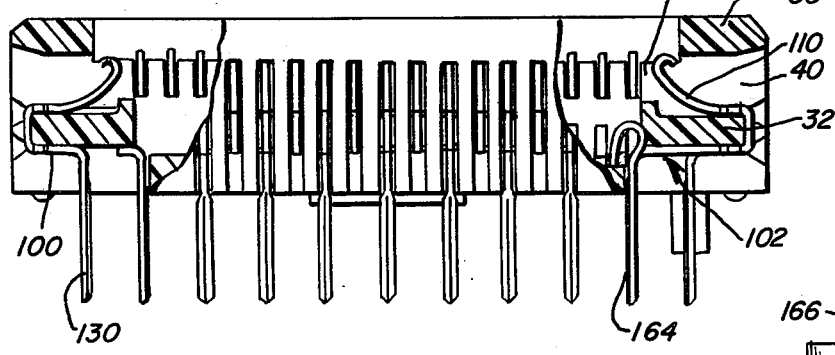
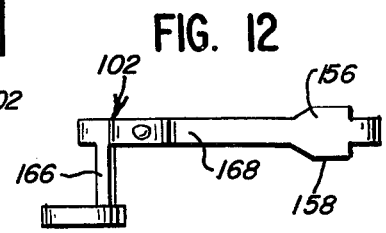
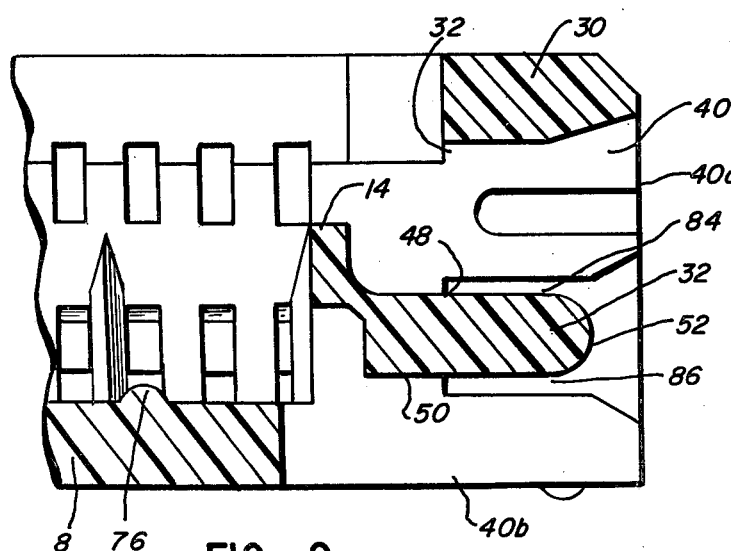
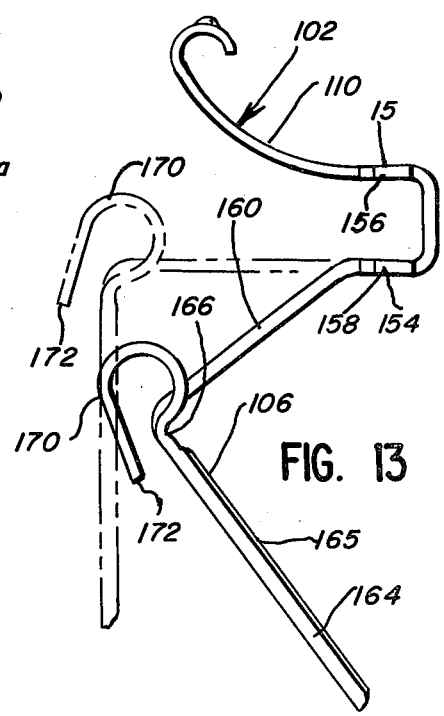

CONTACTS FOR CHIP CARRIER SOCKET

BACKGROUND OF THE INVENTION

This invention relates in general to electrical connectors and, in particular, to a socket for a leadless chip carrier or package.

More specifically, the invention relates to improved contact designs for attaining effective mechanical and electrical connections between a leadless chip carrier or package mounted within the socket and the contacts arranged therein to interconnect the chip carrier to an external electrical circuit.

In numerous electrical applications, such as in microprocessors and the like, a leadless, semi-conductive chip package is connected to a printed circuit board or circuit pad by means of a chip carrier socket. Numerous socket designs have been developed in the prior art to effecuate the connection of the chip carrier to the circuit. One highly desirable objective in many known sockets is to provide access to the active chip component and permit insertion, removal, or replacement as needed.

Generally, a chip package includes a centrally located semi-conductor chip circuit mounted on a substrate having a plurality of conductive strips or segments extending outward to the peripheral areas of the substrate. A matching number of contacts within the chip carrier socket are employed to establish an electrical connection with the conductive areas of the substrate. The socket contacts must be capable of creating a positive and uniform mechanical and electrical connection not only with a chip package at their internally disposed ends, but with the printed circuit board or circuit pad at their external ends.

The terminal ends of the contacts of a socket may be connected to the circuit of a panel by soldering, often referred to as a solder type carrier socket, or by pressure contact of the components, a technique in which the socket is sometimes known as a surface compression type. In the solder type it is necessary for the contacts against which the chip carrier is biased have narrow spacings or centers. Such standard separation of the internal contact ends is, in many cases, too small at the terminal end to allow acceptable soldering to the circuit board. Known designs have not addressed this soldering problem with an effective solution.

Contacts in a solder type socket, and in a surface compression connector as well, are also subject to a considerable loading. For example, these elements in either type of socket may resiliently bear against the chip package in many designs for a suitable connection. The terminal ends of the contacts, particularly in a pressure contact version, are also subject to a force at the terminal ends which is characteristically greater than the load on the contacts exerted by the chip carrier. Known socket techniques have been defective in providing a support means for the socket contacts through which these forces can be adequately handled for continued integrity of the electrical connection between the chip package and the board or pad.

Because a typical chip carrier socket employs a large number of contacts, some sockets having a hundred terminals or more, it is critical that each individual element be properly aligned and permanently affixed after assembly. An optimum degree of such precision with convenience of assembly in the manufacture of sockets of prior designs has not been attained. Accordingly, known contact configurations for chip carrier sockets suffer from numerous deficiencies, because of which a significant need for improved contact designs capable of overcoming many of the problems associated with the prior art is desirable.

SUMMARY OF THE INVENTION

It is, therefore, an object of this invention to provide an improved chip carrier socket.

Another object of this invention is to provide a contact design to attain improved interconnection of a chip carrier with a circuit board and the like.

A further object of this invention is to improve the mounting of contacts with a chip carrier socket.

Still another object of this invention is mechanically to isolate the forces applied to one portion of a contact having an externally applied loading.

A still further object of this invention is to attain proper alignment and locking of the contacts during assembly of a chip carrier socket.

Still another object of this invention is to provide a dual cantilevered contact design for surface mounted carrier sockets.

A still further object of this invention is to provide two different contact designs which cooperatively function as a plurality of pairs in solder type carrier sockets.

These and other objects are attained in accordance with the present invention wherein there is provided improved contact designs for leadless chip carrier sockets of either the surface compression type or the solder type. The contact means herein disclosed are mounted on the socket body in conjunction with base means for better support and protection of the contacts. The contact designs of the invention are provided with means to attain accurate alignment and effective locking of the components after manufacture. One contact design herein disclosed is intended for use in a surface compression type socket and includes a dual beam configuration capable of achieving better mechanical and electrical characteristics. Two additional contact designs of the invention are employed in conjunction with each other in a solder connected socket. These solder contact designs function to effectively sustain the loads exerted by the chip carrier, while providing suitable strong terminal ends spaced from each other by a sufficient distance to permit soldering to a circuit board and the like.

DESCRIPTION OF THE DRAWINGS

Further objects of the invention with additional features contributing thereto and advantages accruing therefrom will be apparent from the following description of preferred embodiments of the invention which are shown in the accompanying drawings with like reference numerals indicating corresponding parts throughout, wherein:

FIG. 1 is a top schematic view with parts broken away of a first embodiment of the chip carrier socket of the invention employing an improved contact design for a surface compression type of socket;

FIG. 2 is a side schematic view, with parts in section, of the chip carrier socket of FIG. 1;

FIG. 3 is a partial bottom schematic view of the chip carrier socket of FIG. 1;

FIG. 4 is a side schematic view of one of contact members of the invention employed in the chip carrier socket of FIG. 1;

FIG. 5 is a top schematic view of the contact member shown in FIG. 4;

FIG. 6 is an end schematic view of the contact member of FIG. 1;

FIG. 7 is a partial bottom schematic view of a second embodiment of the chip carrier socket of the invention employing improved contact designs for a solder type socket;

FIG. 8 is a side schematic view taken along line 8—8 of FIG. 7;

FIG. 9 is an enlarged partial sectional view of the body of carrier socket of FIG. 7;

FIG. 10 is a side schematic view of one of contact members of the invention employed in the carrier socket of FIG. 7;

FIG. 11 is an end schematic view of the contact member of FIG. 10;

FIG. 12 is a top schematic view of another contact member of the invention employed in the carrier socket of FIG. 7; and FIG. 13 is a side schematic view of the contact member of FIG. 12 with its locked configuration shown in phantom.

DESCRIPTION OF THE PREFERRED EMBODIMENTS

Referring now to FIGS. 1 to 6 there is illustrated a first embodiment of the invention for an improved contact design and mounting for a leadless chip carrier socket 2 of a surface compression type. A surface compression type of chip carrier socket in general is attached to a circuit board by means of a fastener, such as a screw, to establish through pressure contact an electrical and mechanical connection between the terminal ends of the socket contacts and the circuit board or pad.

Chip carrier socket 2 includes four corner posts 4 interconnected by four side wall constructions 6 and a bottom wall 8 to create a rectangular chip carrier receiving compartment or receptacle 10. The top portion of carrier socket 2 is open to provide access within receptacle 10 to insert and remove a leadless chip carrier or package as desired. The chip carrier comprises a conventional package (not shown) consisting of a semiconductor chip mounted on a suitable substrate. The substrate is formed with a rectangular configuration substantially to match the shape of receptacle 10, such that the peripheral portions of the substrate will overlie a horizontal ledge or shoulder 14 disposed on all four sides within the receptacle 10. Conductive elements or strips are disposed on the substrate to establish a circuit between the active chip element and a plurality of socket contacts 16 mounted through ledge 14 in a manner to be described.

The chip carrier is pressed against the shoulder 14 by means of a cover assembly 18 pivotally mounted on the outer surface of two corner posts 4. The cover assembly 18 is moveable from an open position to the closed position shown in FIGS. 1 and 2, at which a lip 20 interconnects with a locking bracket 22 to secure the cover in a locked position. In its locked configuration the cover assembly applies a downward force at a plurality of discrete points through four pairs of cantilevered arms 25 downwardly depending from cover frame 26 and contacting the chip carrier at their respective free ends.

The four sidewall constructions 6 defining the receptacle 10 each include an upper continuous wall portion 30 and a series of horizontal base members or horns 32 integrally projecting upward from bottom wall 8 as best shown in FIG. 2. Each of the base members 32 are disposed between adjacent walls of a plurality of rib-like vertical sections 34a and 34b depending downward from wall portion 30 to a bottom edge 36 below the base members 32. As illustrated in FIG. 3 rib sections 34a integrally extend outward from bottom wall 8, while section 34b is spaced therefrom to provide apertures 38 through the bottom wall. Thus, the sections 34a and 34b form contact receiving cavities 40 within the carrier socket 2. The cavities 40 form openings 40a on the outer periphery of the socket and form opening 40b on the bottom of the socket from the outer edge to bottom wall 8 as seen in FIG. 2. The top of sections 34a and 34b extends above the surface of ledge 14 to create a plurality of vertical slots 42 adjacent thereto. A corresponding number of apertures 44 are aligned with cavity 40 and slots 42 and define passages through which a portion of contacts 16 extend downward into cavities 40 for mounting on base member 32. Base members or horns 32 project outward from inner walls 46 which are disposed on the lower sides within receptacle 10. The horns 32 include upper and lower planar surfaces 48 and 50 and end surface 52 having approximately rounded shape.

Each of the apertures 44 are arranged around all four sides of receptacle 10 on the ledge 14 to permit a chip package contacting portion of contacts 16 to protrude therethrough. Any number of apertures 44 and associated contacts 16 may be employed in the socket 2 dependent on circuit requirements such as, for example, sixty-eight positions as shown in FIG. 1.

Referring now to FIGS. 4, 5, and 6, one of the contacts 16 is best illustrated. Contact 16 is formed from a suitable metallic conductive material demonstrating sufficient strength and resiliency to resist the forces applied to it during use. As best seen in FIG. 4, the contacts 16 are constructed as dual cantilevered beams comprising upper portion 60 and lower portion 62. Both portions 60 and 62 are curved outward with a bow-like shape from a central base section 64, which is designed to engage the upper and lower surfaces 48 and 50 of a respective horn 32, as well as at least a portion of end surface 52 thereof. To accomplish such a mounting, central base section 64 possesses a sideway oriented U-shaped configuration consisting of a base segment 66 and two parallel segments 68 and 70 oriented approximately normal thereto.

Upper portion 60 and lower portion 62 of contact 16 are approximately oriented symmetrical to each other about a horizontal axis viewing FIG. 4. In the mounted form of contact 16 shown in FIG. 2, the upward bowed configuration of portion 62 extends from horn 32 to a position adjacent aperture 44 in ledge 14. The upper end 64 of contact 16 is curled backward in a circular shape to result in a portion thereof protruding slightly beyond the surface of ledge 14 in absence of a chip carrier. A raised dimple 66 projects upward from upper end 64 and acts as a terminal to effect a connection between the chip carrier inserted in receptacle 10 and the contact 16.

The lower portion 62 similarly is constructed with downwardly bow-like shape and possesses a curled lower terminal 70 end having a bottom dimple 72 to engage a circuit board or pad (not shown) disposed in compressed contact therewith. The appropriate pressure between terminal 70 and the circuit pad is exerted by a mechanical connector extending respectively through a threaded hole in screw plate 74, which is carried at the bottom of receptacle 50, an aligned hole in the bottom wall 8, and a hole in the circuit board. As seen in FIG. 2, the bottom wall 8 may be provided with a number of raised dimples 76 supporting screw plate 74.

Under loading by the chip carrier and the compression mounting, both the upper and lower cantilevered beams portions 60 and 62 are deflected toward each other, such that portions thereof flatten against the upper and lower surfaces of horn 32. Accordingly, the lever arms of portion 60 and 62 become shorter and the respective portions are rendered structurally stronger. The horn 32 acts as a backup upon which the upper and lower beams are carried and the greater the travel or deflection, the greater the force or strength of the beams as supported by the horn 32. Thus, the horn 32 functions mechanically to isolate the upper beam portion 60 from the lower portion 62 of contact 16.

It should be noted that the lower terminal end is subjected to a greater force from the circuit board or pad than is the upper portion responding to the force exerted by chip carrier. The chip carrier presses down against upper contact end 64 to deflect the upper beam 60 downward until the chip carrier engages ledge 14. To meet the varying strength requirements of the two beams, the upper beam portion 60 is formed with a narrower construction than a lower beam portion 62 which is provided with embossed ribs 78 to prevent bending. As an example illustrating the differences in magnitude of the forces sustained, in certain sockets constructed in accordance with the invention, the lower terminal beam was subjected to 150–200 grams of force as opposed to 90–100 grams applied to the chip carrier side of contact 16.

Referring to FIG. 6 the parallel segments 68 and 70 are each formed with pairs of opposite tabs 80 and 82. The tabs 80 and 82 are designed to be inserted during assembly into aligned slots 84 and 86 disposed above and below horn 32 within sections 34a and 34b as seen in FIGS. 2 and 9. Before assembly, a slight interference between the tabs 80 and 82 and their respective slots 84 and 86 is deliberately provided. This technique allows the memory of the plastic socket body to return to its original position after being distorted during insertion of the tabs 80 and 82 in assembly. As a result the slots apply a locking force on the tabs 80 and 82, such that electrodes 16 can not be readily removed after assembly.

Referring now to FIGS. 7 to 13 there is illustrated another embodiment of the contact designs and mounting of the invention for use in a chip carrier socket. The receptacle forming body of the chip carrier socket 2' of FIGS. 7, 8, and 9 is identical to that described with reference to FIGS. 1, 2, and 3, except for the contacts 100 and 102 employed in socket 2' to permit connection to a circuit by a solder techinque as opposed to surface compression as in the previous embodiment. As shown in FIG. 7 the contacts 100 and 102 include a plurality of terminal ends or pins 104 and 106, respectively, depending downward from chip carrier socket 2'. The rectangular array of pins 104 and 106 are adapted to pass through apertures arranged through a board or pad (not shown). The solder ends thereof are soldered to the underside of a pad and the like having a suitable circuitry, sometimes known as a footprint, to effect an electrical connection therebetween. In many pads a footprint is disposed on both sides of the panel.

The design of contact 100 is different than contact 102, such that the upper chip contacting portions 108 and 110 of contacts 100 and 102, respectively, are alternatively disposed through respective apertures 44 in all four sides of ledge 14 by the physical spacing therebetween. The lower terminal ends of each alternative pair of ends 104 and 106 are, however, aligned as pins lying along a perpendicular axis to the orientation of the extent of the apertures 44 along ledge 14. Because of the unique contact design, each pair of ends 104 and 106 are also separated by a distance which is twice the between center spacing of upper chip contacting ends 108 and 110 to facilitate soldering operations.

Referring now to FIGS. 7, 8, 10, and 11, details of contacts 100 are illustrated. Contact 100 includes a central mounting base section 120 having a configuration to mount the contact body on the horn 32 in a similar manner as the contacts described with reference to the previous embodiment of FIGS. 1 to 6. Central mounting section 120 is provided with upper and lower segments 122 and 124 to bear against the surfaces 48 and 50 of the base member or horn 32. Similarly, the interconnecting segment 126 substantially conforms to the end face 52 of the horn 32, such that the central section 120 is mounted in use on the horn 32 as shown in FIG. 8. A pair of tabs 128 and 129 protrude from the ends of upper and lower segments 122 and 124 respectively, to act as locking tabs in slots 84 and 86 as previously described.

As shown in FIG. 11 the end to end extent of contact 100 is disposed in a common plane. The terminal end portion 104 is bent at an angle of approximately 90 degrees to lower segment 124 at a point immediately below horn 32 to project downward through openings 40b in the bottom of the socket body and provide solder tails 130. The terminal end portion includes ribs 132 to resist bending during mounting. The upper portion 108 of contact 100 is similarly constructed as the upper part of previously described contacts 16. Upper portion 108 projects upward in a bowed configuration and terminates with a curled end 142 having dimple 144 to contact the chip carrier inserted into receptacle 10. The upper end of portion 108 projects through apertures 44 in absence of a chip carrier, but are resiliently pressed down as the cover assembly presses the chip carrier against ledge 14 as previously described. The upper surface of a horn 32 supports the upper portion 108 in a similar manner as in the previous embodiment of FIGS. 1 to 6. It should be apparent that the terminal end portion 104 also is supported by the bottom surface of horn 32 to isolate the two ends of the contact 100.

Referring now to FIGS. 8, 12, and 13, there is illustrated the design of the second set of contacts 102 in accordance with the invention. The upper portion of contact 102 is similar in construction to the corresponding portion 108 of contact 100 and is adapted to function in a similar manner in cooperation with a chip carrier. The central mounting portion 150 for mounting on horn 32 is similar to the same portion of contact 100, except that the upper and lower segments 152 and 154 in the unmounted configuration of FIG. 13 are approximately equal in length, while lower segment 124 of contact 100 possesses a longer dimension than upper segment 122. Four locking tabs 156 and 158 are positioned on lower and upper segment 124 and 126.

As shown in FIG. 13 the terminal end portion 106 includes an elongated section 160 which, in its unmounted form, integrally depends downward for a length greater than the length of lower segment 154. As shown in FIGS. 12 and 13 a solder tail or end 164, having rib formations 165, is offset from the section 160 by an integral leg 166 disposed perpendicular to both sections when viewing FIG. 12. It should be apparent, therefore, that leg 166 is disposed normal to section 162 and solder tail 164 is bent downward normal to leg 166. A loop-like locking element 170 is curved upward from the solder tail 164 and has a downward curved end 172 to engage bottom wall 8, adjacent the edge of a plurality of apertures 174 provided therethrough, and lock the terminal in place and assume the straightened configuration of FIG. 8 and in phantom in FIG. 13 when mounted.

In mounting the contact onto the socket 2 during assembly, it is generally preferable first to attach contacts 102 at their alternate positions around the receptacle. Each of contacts 102 is attached by bending the elongated section 160 relative to the lower horn bearing segment 154 to cause the end 172 of locking element 170, which is capable of limited deformation, to engage bottom wall 8 by snapping into place as shown in FIG. 13. In its mounted position, the upper surface of elongated section 160 is adapted to bear against the bottom of horn 32 for support of the terminal end portion 160 in mechanical isolation from the upper position 150.

As decribed previously and shown in FIG. 7 the solder tails 130 and 164 of adjacent pairs of contacts 100 and 102 are aligned in a normal direction by twice the amount of separation as the chip carrier dimples along ledge 14. Such a relationship of the solder tails is achieved, because the right angled leg 166 of contact 102 extends through aperture 38 in bottom wall 8 adjacent to the inner edge of rib forming section 34b.

Because the length of the leg 166 of contact 102 (FIG. 12) is equal to the center to center separation of the chip carrier contacts, the downward depending solder tail 164 of contact 102 is then aligned inwardly normal to the upper contact arrangement. The increased separation of solder tails 130 and 164 occurs, because the combined length of the horn contacting sections 154 and 160 of contact 102 is greater than the length of the corresponding inwardly disposed part 124 of contact 100 by a distance that is twice the magnitude of the between center spacing of the contacts 100 and 102 in apertures 44 of ledge 14. As a result, each aligned pair of solder pins 130 and 164 is spaced from each other and from the adjacent aligned pair of pins 130 and 164 by an equal distance. For example, in one form of a 68 position socket illustrated in FIGS. 7 and 8, the center spacing between the upper chip engaging contacts is 0.05 inches, while the center spacing of the adjacent pairs of solder tails is 0.10 inches.

While the invention has been described with reference to preferred embodiments, it will be understood by those skilled in the art that various changes may be made and equivalents may be substituted for elements thereof without departing from the scope of the invention. In addition, many modifications may be made to adapted a particular situation or material to the teachings of the invention without departing from the essential scope thereof. Therefore, it is intended that the invention not be limited to the particular embodiments disclosed as the best mode contemplated for carrying out this invention, but that the invention will include all embodiments falling within the scope of the appended claims.

What is claimed is:

1. A leadless chip carrier socket comprising:
   receptacle means for forming a chip carrier receiving receptacle;
   contact means having a plurality of chip carrier portions adapted to be electrically connected to a chip carrier inserted in said receptacle;
   said contact means further having a plurality of terminal portions extending outwardly of said receptacle means for connection with an electrical circuit;
   said contact means further having a plurality of base sections interconnecting each of said chip carrier portions and said terminal portions;
   base means coupled to said receptacle means having surfaces for supporting said plurality of base sections, said surfaces of said base means include an upper and lower surface and an end face disposed therebetween;
   said base means acting mechanically to isolate the forces applied to said chip carrier portions by the chip carrier from the forces applied to said terminal portions in connection to the electrical circuit;
   said chip carrier portions having flat base contacting sections lying in generally flat relationship to said upper surface and bowed upper end sections curving up to provide a contact end spaced above said base means for connection to a chip carrier;
   said terminal portions having flat base contacting sections lying in generally flat relationship to said lower surface and bowed lower end section curving down to provide a terminal end spaced below; and
   portions of said bowed upper end sections and said bowed lower end sections respectively being flattened against said upper and lower surfaces for a length dependent on the compressive loading on the contact end and terminal end after mounting.

2. The socket according to claim 1 wherein each of said chip carrier portions and said terminal portions extend from said base sections as a pair of cantilevered members having a free end contacting the chip carrier and the electrical circuit, respectively.

3. An electrical contact for use in a chip carrier socket comprising:
   first and second contact portions extending outward from each other in opposite directions;
   said first and second contact portions forming a pair of cantilevered arms having respective free ends;
   a generally U-shaped base section interconnecting said first and second contact portions;
   the free ends of said first and second contact portions include a bow-shaped configuration;
   said first and second contact portions are symmetrically arranged relative to said U-shaped base section;
   said free end portions are curved back to form surfaces to establish an electrical connection with a circuit component in contact therewith.

4. The contact according to claim 3 wherein said second portion includes reinforcement means for providing greater mechanical strength to said second portion in comparison to said first portion.

5. The socket according to claim 1 wherein said receptacle means includes slot means positioned adjacent said base means, tab means mounted on said base sections for insertion into said slot means and lock each of said contact means on said receptacle means.

6. The socket according to claim 5 wherein said slot means includes a pair of open-ended slots positioned on opposite sides of said base means.

7. The socket according to claim 5 wherein said tab means includes first and second pairs of tabs for respective insertion in said slot means.

8. In a chip carrier socket for connecting an active semi-conductive chip to an electrical circuit comprising:
   a socket housing, first contact means mounted on said socket housing and having a plurality of upper ends for contacting the chip carrier and a plurality of lower ends for connection to the electrical circuit;
   second contact means mounted on said socket housing and having a plurality of upper ends for contacting the chip carrier and a plurality of lower ends for connection to the electrical circuit;
   each of said upper ends of the first contact means being arrange in side by side relationship with an upper end of said second contact means along a first axis;
   said lower ends of said first and second contact means being arranged in alternate pairs, each pair being aligned along a second axis perpendicular to said first axis;
   said first and second contact means each include a generally U-shaped base section positioned between said upper and lower ends;
   said upper ends of said first and second contact means are the curved free ends of cantilevered arms;
   said lower ends are partially formed by a depending portion of said first and second contact means extending perpendicular to said U-shaped base section;
   said depending portion of said second contact means is connected to said U-shaped base section by a leg member extending parallel to said first axis in a perpendicular relationship to said base section and said depending portion;
   said second contact means includes locking means to engage a portion of the socket housing in a locking relationship;
   said locking means having looped member extending above said depending portion and having a free end to engage a shoulder formed on said socket housing, said looped member being flexible to snap into place on said shoulder during insertion into said socket housing.

9. In the socket according to claim 8 wherein said base sections include tab means for locking said first and second contact means to the socket housing.

* * * * *